US007439619B2

(12) United States Patent
Chu et al.

(10) Patent No.: US 7,439,619 B2

(45) Date of Patent: Oct. 21, 2008

(54) ELECTRONIC PACKAGE STRUCTURE AND THE PACKAGING PROCESS THEREOF

(75) Inventors: Chi-Chih Chu, Kaohsiung (TW); Gwo-Liang Weng, Kaohsiung (TW); Shih-Chang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 801 days.

(21) Appl. No.: 11/028,718

(22) Filed: Jan. 3, 2005

(65) Prior Publication Data

US 2005/0146054 A1 Jul. 7, 2005

(30) Foreign Application Priority Data

Jan. 2, 2004 (TW) .............................. 93100022 A

(51) Int. Cl.
*H01L 23/34* (2006.01)

(52) U.S. Cl. ....................................... 257/723; 257/735

(58) Field of Classification Search ................. 257/723, 257/735

See application file for complete search history.

(56) References Cited

U.S. PATENT DOCUMENTS 5,708,294 A * 1/1998 Toriyama .................... 257/676
6,670,222 B1 * 12/2003 Brodsky ..................... 438/118

* cited by examiner

*Primary Examiner*—Douglas M Menz
(74) *Attorney, Agent, or Firm*—J.C. Patents

(57) ABSTRACT

The present invention provides an electronic packaging process. The surface of the chip carrier includes at least a chip attachment region and a film attachment region adjacent to the chip attachment region. At least a baffle is formed on the surface of the chip carrier, between the chip attachment region and the film attachment region. After attaching the thin film to the film attachment region of the chip carrier through an affixture layer, the chip is electrically and physically connected to the chip attachment region of the chip carrier through an adhesive layer. The baffle can effectively prevent the gas that is released from the adhesive layer from damaging the bonding between the thin film and the affixture layer. Therefore, almost no bubbles are formed and good electrical connection between the thin film and the affixture layer is maintained.

7 Claims, 3 Drawing Sheets

ELECTRONIC PACKAGE STRUCTURE AND THE PACKAGING PROCESS THEREOF

CROSS-REFERENCE TO RELATED APPLICATION

This application claims the priority benefit of Taiwan application serial no. 93100022, filed on Jan. 2, 2004.

BACKGROUND OF THE INVENTION

1. Field of Invention

The present invention relates to an electronic package structure and the packaging process thereof. More particularly, the present invention relates to an electronic package structure and the packaging process thereof, by providing at least a baffle to prevent bubbles formed between the thin film and the affixture layer.

2. Description of Related Art

Following the advances in technology and development and growth of electronics industry, broad and extensive applications have been proposed for integrated circuits (ICs). In the semiconductor industry, integrated circuits (ICs) manufacture can be categorized as design of the ICs, fabrication of the ICs, packaging of the ICs and testing of the ICs. Among them, IC packaging has great influences in determining the performance of the ICs. For the level-1 packaging technology of IC packaging, there are three major types of bonding technologies: wire bonding (WB), flip chip bonding (FC) and tap automated bonding (TAB). Flip chip bonding technology has become widely used nowadays, because the flip chip package provides high-density pitch, compact size and high electrical performance.

Taking the flip chip bonding technology in combination of the anisotropic conductive film (ACF) as an example, bumps of the chip are electrically connected to the bonding pads of the chip carrier through the conductive particles within the anisotropic conductive film, while the chip and the chip carrier are physically connected by the thermosetting adhesive of the ACF. In order to enhance the bonding strength between the chip and the carrier, the adhesive of the ACF is heated through heating the chip. However, the adhesive of the ACF will release scorching gas under high temperature.

FIG. 1A is a top view of a conventional electronic package structure, while FIG. 1B is a cross-sectional view of FIG. 1A along the line I-I. For example, the electronic package structure 100 can be applied to a fingerprint sensor. Referring to the FIGS. 1A and 1B, the electronic package structure 100 includes a chip carrier 110, a plurality of chips 124, a thin film 132 and a transmission line 150. The chip 124 and the thin film 132 are attached to the surface of the chip carrier 110. The transmission line 150 is electrically connected to the lines on the surface of the chip carrier 110.

Usually, the chip 124 and the thin film 132 are attached to the surface of the chip carrier 110 by attaching the thin film 132 to an affixture layer 134, followed by attaching to the film attachment region 130 on the surface of the chip carrier 110, and then attaching the chip 124 to the chip attachment region 120 on the surface of the chip carrier 110 through an adhesive layer 122 in a flip-chip bonding manner. Then, a bond head 126 is used to directly heat the chip 124. Thus, heat is transfer from the chip 124 to the adhesive layer 122, which leads to softening of the adhesive layer 122 and the release of hot gas from the adhesive layer 122. The scorching gas released from the adhesive layer 122 will flow along the direction F1 and degrade the bonding between the thin film 132 and the affixture layer 134. Therefore, bubbles are formed between the thin film 132 and the affixture layer 134. In this case, the thin film 132 may easily peel from the affixture layer 134 and the poor connection between the thin film 132 and the affixture layer 134 hinder electrical transmission between the thin film 132 and the chip carrier 110, thus decreasing the yield of the electronic package structure.

SUMMARY OF THE INVENTION

The present invention provides an electronic package structure and the packaging process thereof by providing at least a baffle, which improves the yield of the package structure.

The present invention provides an electronic package structure and the packaging process thereof, applicable for attaching at least a chip and a thin film to a chip carrier. By providing at least a baffle between the chip and the thin film, almost no bubbles are formed between the thin film and the affixture layer and good connection between the thin film and the affixture layer is maintained.

As embodied and broadly described herein, an electronic packaging process, applicable for attaching at least a chip and a thin film to a chip carrier, is provided. The surface of the chip carrier includes at least a chip attachment region and a film attachment region adjacent to the chip attachment region. At first, at least a baffle is formed on the surface of the chip carrier, the baffle being disposed between the chip attachment region and the film attachment region. After attaching the thin film to the film attachment region of the chip carrier through an affixture layer, the chip is electrically and physically connected to the chip attachment region of the chip carrier through an adhesive layer. The baffle can effectively prevent the gas that is released from the adhesive layer from damaging the bonding between the thin film and the affixture layer. Therefore, almost no bubbles are formed and good electrical connection between the thin film and the affixture layer is maintained.

As embodied and broadly described herein, the present invention provides an electronic package structure, comprising a chip carrier having at least a chip attachment region and a film attachment region adjacent to the chip attachment region, a thin film, attached to the film attachment region and at least a baffle, disposed on the surface of the chip carrier and between the chip attachment region and the film attachment region. An adhesive layer disposed between the chip and the chip attachment region can be further included for attaching the chip to the chip attachment region. An affixture layer disposed between the thin film and the film attachment region can be further included for attaching the thin film to the film attachment region.

In accordance with this invention, because the baffle is disposed between two different regions, the gas released from the material in one region is led away from entering the other region, thus protecting the other region from being influenced or damaged by the released gas. Hence, the yield and the reliability of the assembly or the package structure are enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
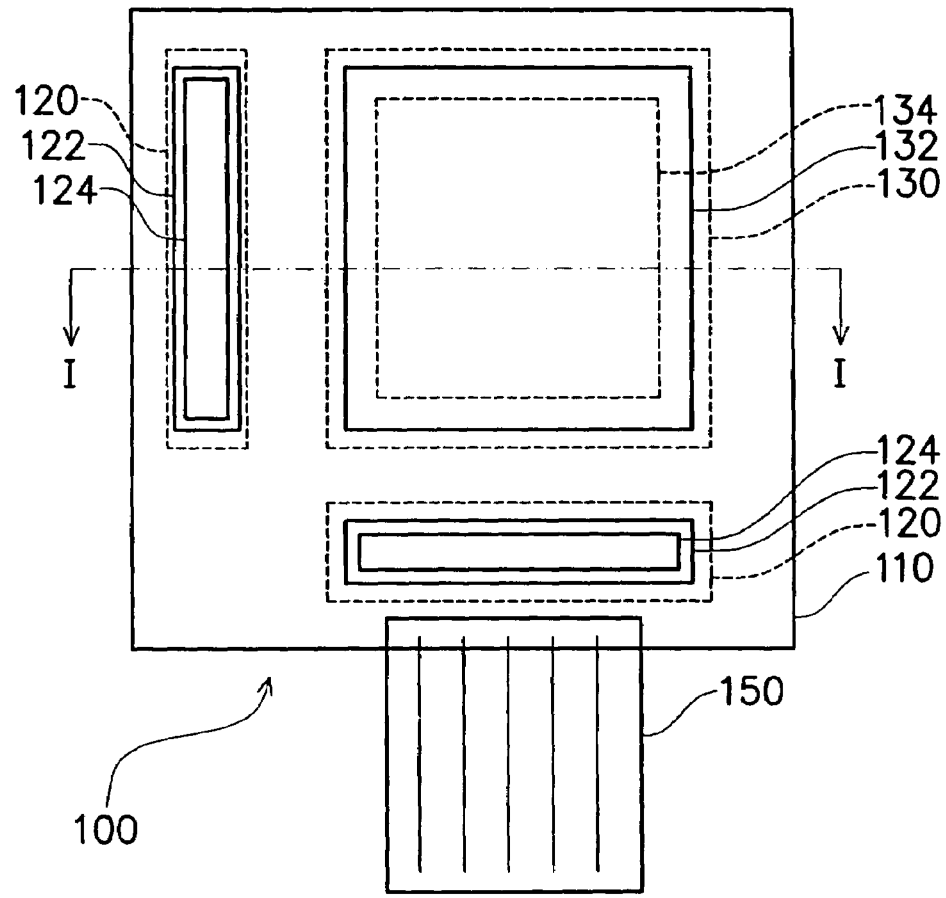
FIG. 1A is a top view of a conventional electronic package structure.
Figure 1B:
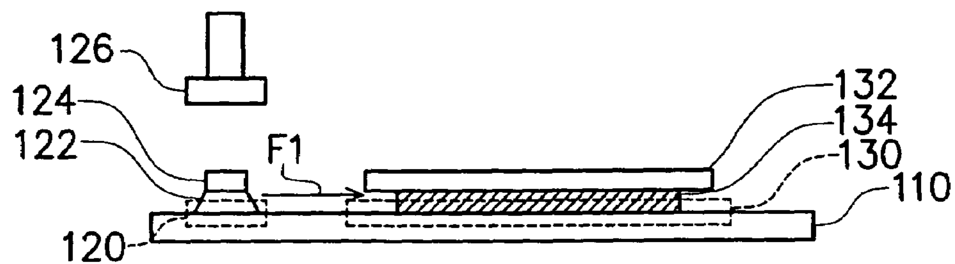
FIG. 1B is a cross-sectional view of the conventional electronic package structure in FIG. 1A.
Figure 2A:
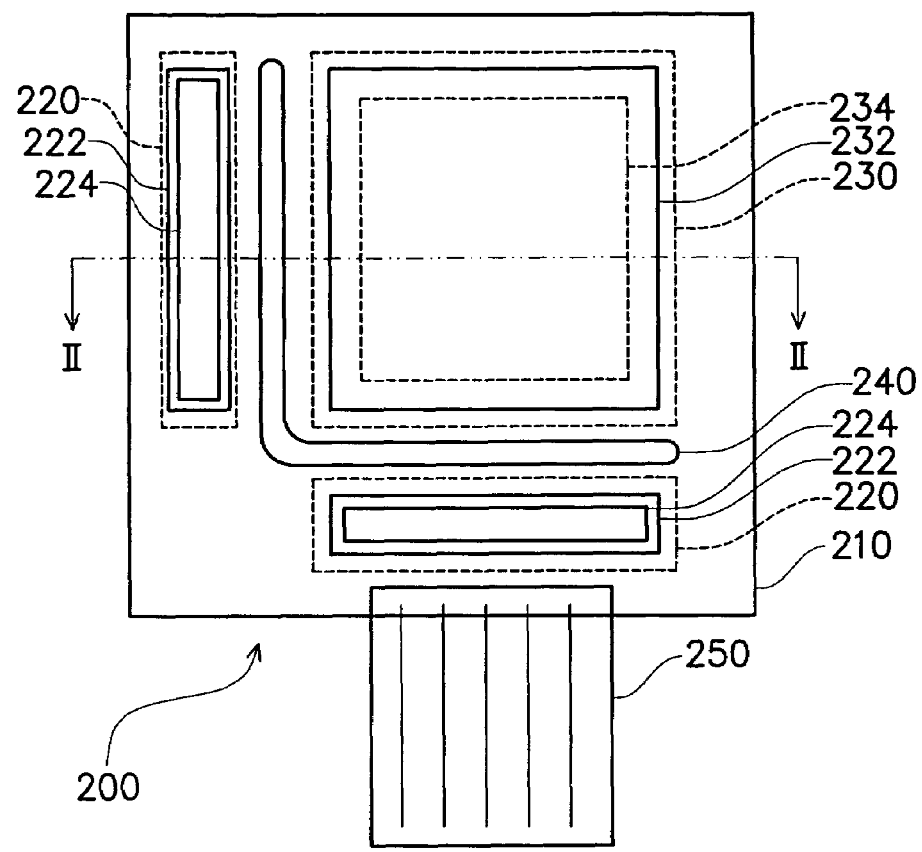
FIG. 2A is a schematic top view of an electronic package structure according to one preferred embodiment of this invention.
Figure 2B:
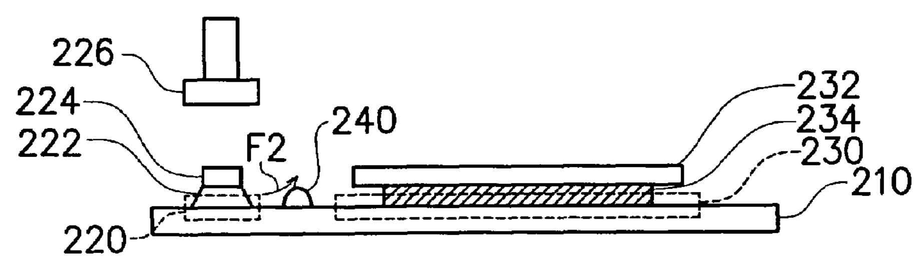
FIG. 2B is a schematic cross-sectional view of the electronic package structure according to one preferred embodiment of this invention.
Figure 3:
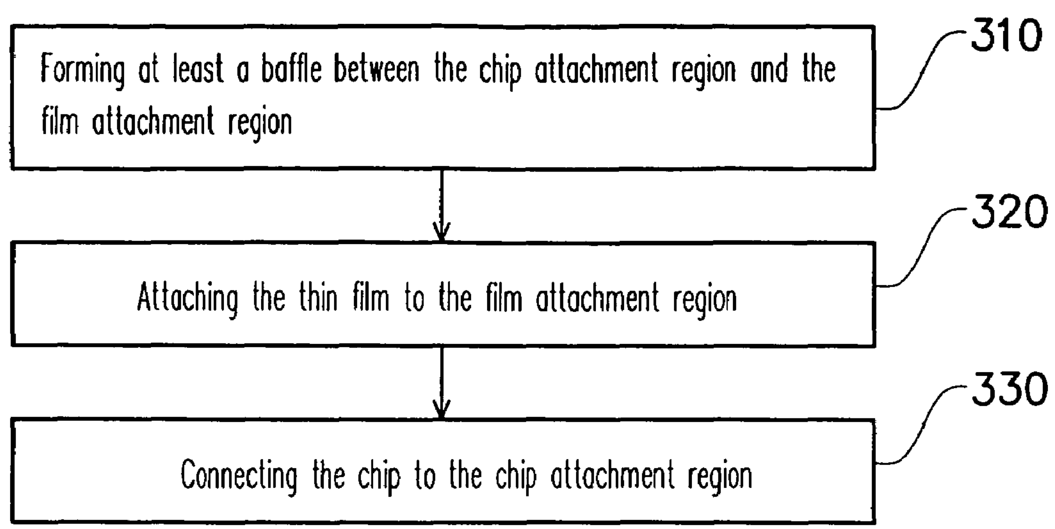
FIG. 3 is a flow chart illustrating a fabrication process for the electronic package structure according to one preferred embodiment of this invention.

FIG. 2A is a schematic top view of an electronic package structure according to one preferred embodiment of this invention, while FIG. 2B is a schematic cross-sectional view of FIG. 2A along the line II-II. FIG. 3 is a flow chart illustrating a fabrication process for the electronic package structure according to one preferred embodiment of this invention.

In accordance with this invention, the electronic package structure 200 can be applied to a fingerprint sensor, for example. Referring to the FIGS. 2A and 2B, the electronic package structure 200 includes a chip carrier 210, a plurality of chips 224, a thin film 232 and a transmission line 250. The chip carrier 210 is made of glass, and the chip 224 can be an application-specific IC (ASIC) chip, for example. On the surface of the chip carrier 210, a chip attachment region 220 and a film attachment region 230 are included. The chip 224 and the thin film 232 are attached to the surface of the chip carrier 210. The transmission line 250 is, for example, a flexible printed-circuit (FPC), electrically connected to the lines on the surface of the chip carrier 210.

At first, in step 310, at least a baffle 240 is formed on the surface of the chip carrier 210, between the chip attachment region 220 and the film attachment region 230. The baffle 240 can be in a strip shape, either a straight strip or a bent strip, for example. The shape of the baffle 240 can be adjusted according to the layout design of the package structure. The material of the baffle 240 can be Mylar, for example.

Then, in step 320, the thin film 232 is attached to the film attachment region 230 of the chip carrier 210 through an affixture layer 234. The affixture layer 234 is, for example, a thermosetting adhesive layer. Alternatively, if the bottom surface of the thin film 232 turns sticky after being heated, the thin film 232 is placed on the film attachment region 230 of the chip carrier 210 and then the thin film is heated, so as to fix the thin film to the film attachment region 230 of the chip carrier 210.

In step 330, the chip 224 is attached to the chip attachment region 220 of the chip carrier 210 through an adhesive layer 222, for example, in a flip-chip bonding manner. The adhesive layer 222 can be an anisotropic conductive film (ACF), for example. The ACF includes a plurality of conductive particles for electrically connecting the bumps (not shown) of the chip 224 to bonding pads (not shown) of the chip carrier 210, while the adhesives in the ACF can physically connects the chip 224 and the chip carrier 210. Alternatively, the adhesive layer 222 can be an underfill layer used commonly in the flip chip bonding process, for example. In this case, after attaching the bumps of the chip 224 to bonding pads of the chip carrier 210, the underfill material is filled in-between the chip 224 and the chip carrier 210.

In step 330, a bond head 226 can be used to directly heat the chip 224, if the adhesive layer 222 is thermally cured. Thus, heat is transfer from the chip 224 to the adhesive layer 222, which leads to softening of the adhesive layer 222 and the release of hot gas from the adhesive layer 222. The scorching gas released from the adhesive layer 222 will flow along the direction F2. Hence, the gas released from the adhesive layer 222 will not flow in-between the thin film 232 and the affixture layer 234 and will not degrade the bonding between the thin film 232 and the affixture layer 234. It is because the baffle can effectively block the hot gas from flowing in-between the thin film 232 and the affixture layer 234. Therefore, almost no bubbles are formed between the thin film 232 and the affixture layer 234 and the thin film 232 will not peel from the affixture layer 234. Consequently, good electrical connection between the thin film 232 and the chip carrier 210 is maintained and electrical transmission is established between the thin film 232 and the chip carrier 210, thus efficiently improving the yield of the electronic package structure.

In accordance with this invention, because the baffle is disposed between two different regions, the gas released from the material in one region is led away from entering the other region, thus protecting the other region from being influenced or damaged by the released gas. Hence, the yield and the reliability of the assembly or the package structure are enhanced.

In the present invention, the package structure is not limited to be applied to the fingerprint sensor, but can be applied to other electronic package structures. Moreover, the bonding between the chip and the chip carrier is not limited to flip chip bonding, but can be other bonding technologies or simply attached through the adhesive layer(s). Similarly, the adhesive layer is not limited to the ACF or the underfill layer, but can be any other material layer that release gases during heating.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic package structure, comprising:

a chip carrier having at least a chip attachment region and a film attachment region adjacent to the chip attachment region on a surface of the chip carrier;

at least a chip, attached to the chip attachment region of the chip carrier;

a thin film, attached to the film attachment region of the chip carrier, and at least a baffle, disposed on the surface of the chip carrier and located between the chip attachment region and the film attachment region.

2. The structure of claim 1, further comprising an adhesive layer, disposed between the chip and the chip attachment region, wherein the chip is attached to the chip attachment region by the adhesive layer.

3. The structure of claim 2, wherein the adhesive layer includes an anisotropic conductive film for electrically and physically connecting the chip to the chip carrier.

4. The structure of claim 1, wherein the chip is connected to the chip carrier by flip chip bonding.

5. The structure of claim 1, further comprising an affixture layer, disposed between the thin film and the film attachment region, wherein the thin film is attached to the film attachment region by the affixture layer.

6. The structure of claim 5, wherein the affixture layer includes a thermosetting adhesive layer.

7. The structure of claim 1, wherein the baffle is in a strip shape.

* * * * *